US012595980B2

(12) United States Patent (10) Patent No.: US 12,595,980 B2
Matsugi et al. (45) Date of Patent: Apr. 7, 2026

(54) COMPOSITE MEMBER

(71) Applicant: A.L.M.T. Corp., Tokyo (JP)

(72) Inventors: Ryota Matsugi, Osaka (JP); Isao Iwayama, Osaka (JP); Chieko Tanaka, Toyama (JP); Hideaki Morigami, Toyama (JP)

(73) Assignees: Sumitomo Electric Industries, Ltd., Osaka (JP); A.L.M.T. Corp., Tokyo (JP)

( * ) Notice: Subject to any disclaimer, the term of this patent is extended or adjusted under 35 U.S.C. 154(b) by 520 days.

(21) Appl. No.: 17/285,508

(22) PCT Filed: Aug. 30, 2019

(86) PCT No.: PCT/JP2019/034151
§ 371 (c)(1),
(2) Date: Apr. 15, 2021

(87) PCT Pub. No.: WO2020/084903
PCT Pub. Date: Apr. 30, 2020

(65) Prior Publication Data
US 2021/0381782 A1 Dec. 9, 2021

(30) Foreign Application Priority Data
Oct. 25, 2018 (JP) ................................. 2018-201235

(51) Int. Cl.
*F28F 21/08* (2006.01)
*B23K 35/30* (2006.01)
(Continued)

(52) U.S. Cl.
CPC ........ *F28F 21/089* (2013.01); *B23K 35/3006* (2013.01); *C22C 5/08* (2013.01);
(Continued)

(58) Field of Classification Search
CPC ........ C22C 5/08; C22C 26/00; H01L 23/3735
See application file for complete search history.

(56) References Cited

U.S. PATENT DOCUMENTS

2014/0220238 A1* 8/2014 Abbel .................... H05K 1/092
252/512
2015/0093500 A1* 4/2015 Sapirman .............. H01L 33/405
427/124
(Continued)

FOREIGN PATENT DOCUMENTS

CN 106688092 A 5/2017
CN 106796927 A 5/2017
(Continued)

*Primary Examiner* — Maria V Ewald
*Assistant Examiner* — Ethan Weydemeyer
(74) *Attorney, Agent, or Firm* — Faegre Drinker Biddle & Reath LLP

(57) ABSTRACT

A composite member having an excellent heat resistance is provided. The composite member includes: a substrate composed of a composite material including a non-metal phase and a metal phase; and a metal layer that covers at least a portion of a surface of the substrate, wherein a metal included in each of the metal phase and the metal layer is mainly composed of Ag, and a ratio of a content of Cu to a total content of Ag and Cu in a boundary region of the metal layer with the substrate is less than or equal to 20 atomic %.

10 Claims, 3 Drawing Sheets

(51) Int. Cl.

| | |
|---|---|
| *C22C 5/08* | (2006.01) |
| *C22C 26/00* | (2006.01) |
| *H01L 23/373* | (2006.01) |
| *H10W 40/25* | (2026.01) |
| *B23K 101/40* | (2006.01) |
| *B23K 103/08* | (2006.01) |
| *B23K 103/16* | (2006.01) |

(52) U.S. Cl.

CPC ........... *C22C 26/00* (2013.01); *H10W 40/255* (2026.01); *B23K 2101/40* (2018.08); *B23K 2103/08* (2018.08); *B23K 2103/16* (2018.08)

(56)     References Cited

U.S. PATENT DOCUMENTS

| | | | |
|---|---|---|---|
| 2016/0336253 A1 | 11/2016 | Fukui | |
| 2017/0145280 A1 | 5/2017 | Morikawa et al. | |
| 2017/0287810 A1* | 10/2017 | Morikawa | ........... H01L 23/3735 |
| 2019/0297725 A1 | 9/2019 | Iwayama et al. | |

FOREIGN PATENT DOCUMENTS

| | | | |
|---|---|---|---|
| JP | 2016-184700 A | 10/2016 |
| WO | WO-2016/035795 A1 | 3/2016 |
| WO | WO-2018/105297 A1 | 6/2018 |

* cited by examiner

COMPOSITE MEMBER

TECHNICAL FIELD

The present disclosure relates to a composite member. The present application claims a priority based on Japanese Patent Application No. 2018-201235 filed on Oct. 25, 2018, the entire content of which is incorporated herein by reference.

BACKGROUND ART

PTL 1 discloses a heat radiation member including: a substrate composed of a composite material including silver and diamond; and a silver layer that covers a surface of the substrate.

CITATION LIST

Patent Literature

PTL 1: WO 2016/035795

SUMMARY OF INVENTION

A composite member of the present disclosure includes: a substrate composed of a composite material including a non-metal phase and a metal phase; and a metal layer that covers at least a portion of a surface of the substrate, wherein a metal included in each of the metal phase and the metal layer is mainly composed of Ag, and a ratio of a content of Cu to a total content of Ag and Cu in a boundary region of the metal layer with the substrate is less than or equal to 20 atomic %.

DETAILED DESCRIPTION

Figure 1:
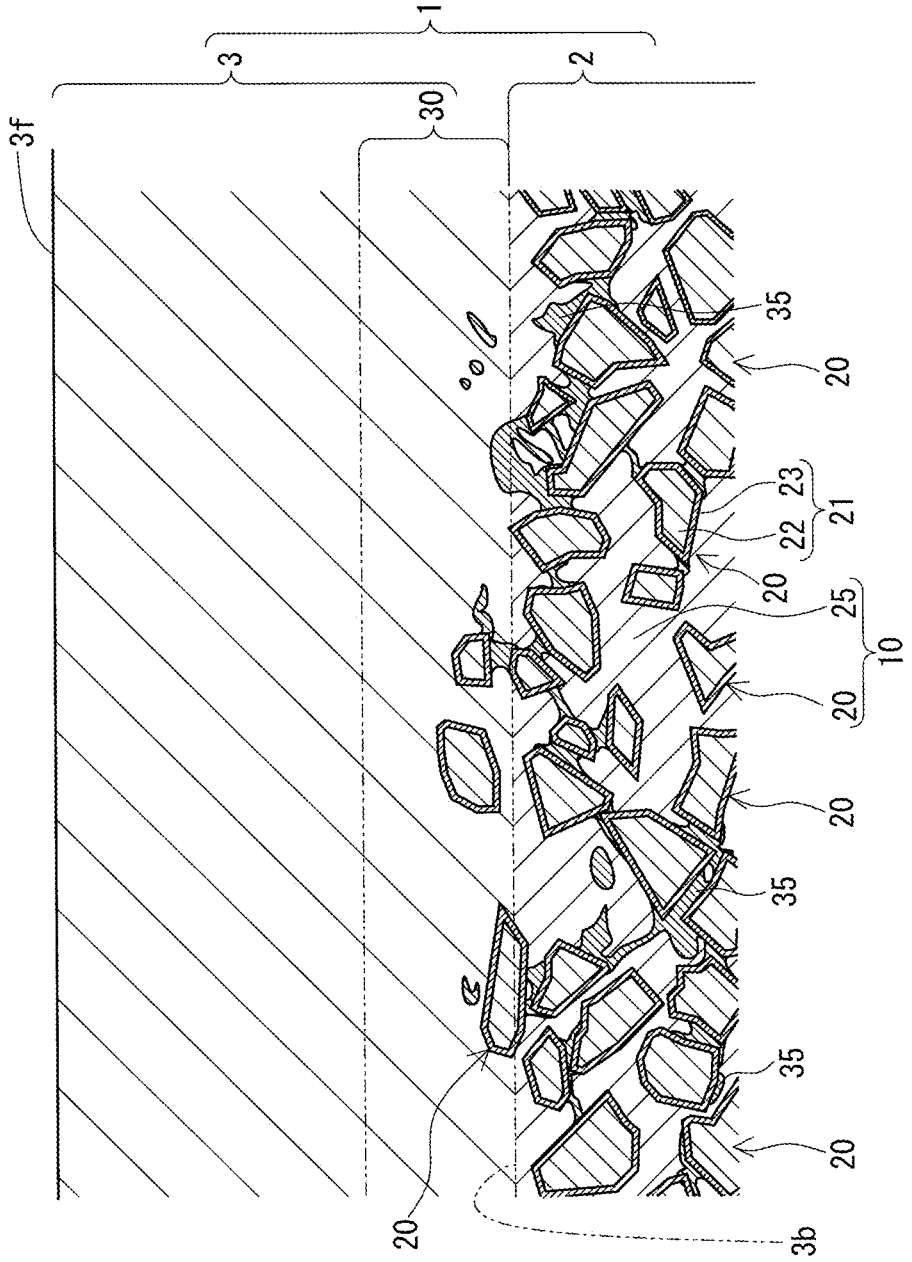
FIG. 1 is a partial cross sectional view schematically showing a composite member according to an embodiment.

Problem to be Solved by the Present Disclosure

A composite member including a substrate composed of a composite material including a non-metal phase and a metal phase and a metal layer that covers a surface of the substrate is required to have an excellent heat resistance. The composite member may be exposed to a high temperature of about 800° C. or about 830° C. There has been required a composite member having a heat resistance with which the following phenomenon does not occur even when exposed to such a high temperature: blistering of the metal layer; separation of the metal layer from the substrate; or disappearance of the metal layer due to the metal layer being melted.

Thus, it is one of objects of the present disclosure to provide a composite member having an excellent heat resistance.

Advantageous Effect of the Present Disclosure

The composite member of the present disclosure has an excellent heat resistance.

DESCRIPTION OF EMBODIMENTS

First, contents of embodiments of the present disclosure will be listed and described.

(1) A composite member according to one embodiment of the present disclosure includes:

a substrate composed of a composite material including a non-metal phase and a metal phase; and a metal layer that covers at least a portion of a surface of the substrate, wherein a metal included in each of the metal phase and the metal layer is mainly composed of Ag, and a ratio of a content of Cu to a total content of Ag and Cu in a boundary region of the metal layer with the substrate is less than or equal to 20 atomic %.

The expression "mainly composed of Ag" means that the content of Ag is more than or equal to 80 atomic %.

Details of the "boundary region of the metal layer with the substrate" will be described later.

The composite member of the present disclosure has an excellent heat resistance as described below. Particularly, in the composite member of the present disclosure, the metal layer can be appropriately maintained even when exposed to a high temperature such as about 800° C. or about 830° C.

The metal layer, inclusive of the boundary region with the substrate, is mainly composed of Ag (silver). Particularly, in the boundary region of the metal layer with the substrate, the ratio of the content of Cu (copper) is small to be less than or equal to 20 atomic % with respect to the total content of Ag and Cu. Such a metal layer can be produced, for example, as follows. A substrate of a composite material including a metal phase mainly composed of Ag is joined, by a brazing material including Ag and Cu, to a metal member (for example, a metal foil) mainly composed of Ag and serving as a source material of the metal layer mainly composed of Ag. Further, Cu in the brazing material is diffused into the metal phase and the metal member. Here, representative examples of the brazing material including Ag and Cu include a brazing material that is based on an eutectic alloy in which the content of Ag is about 72 mass % and the content of Cu is about 28 mass %. The content of Cu in the eutectic alloy is about 40 atomic % when the total content of Ag and Cu is assumed to be 100 atomic % in atomic ratio. Cu in such a brazing material is diffused into the metal phase and the metal member to reduce the content of Cu to be less than or equal to 20 atomic % with respect to the total content of Ag and Cu. In this way, the above-described boundary region can be formed.

It can be said that in the boundary region in which the content of Cu is less than or equal to 20 atomic % with respect to the total content of Ag and Cu, there exist substantially no eutectic alloy of Ag and Cu or substantially no alloy that is based on the eutectic alloy (hereinafter, they may be collectively referred to as "eutectic alloy or the like"). Therefore, even when the composite member of the present disclosure is exposed to a temperature of more than the melting temperature (for example, 780° C.) of the eutectic alloy or the like, melting of the eutectic alloy or the like is unlikely to occur, or preferably, does not substantially occur. Therefore, in the composite member of the present disclosure, the following phenomenon can be prevented: blistering of the metal layer due to melting of the eutectic alloy or the like; separation of the metal layer from the substrate; or disappearance of the metal layer due to the whole of the metal layer being melted. It can be said that such a composite member of the present disclosure has a heat-resistant temperature of more than 800° C., for example, a heat-resistant temperature of 830° C. and therefore has an excellent heat resistance.

On the other hand, it can be said that when the ratio of the content of Cu in the boundary region is more than 20 atomic %, particularly, when the ratio of the content of Cu in the boundary region is closer to 40 atomic % with respect to the total content of Ag and Cu, the above-described eutectic alloy or the like is included in the boundary region. When the eutectic alloy or the like is included in the boundary region, the eutectic alloy or the like is melted when exposed to such a high temperature as described above. The melting of the eutectic alloy or the like is considered to cause occurrence of the above-described phenomenon such as the blistering, separation, or disappearance of the metal layer.

Further, the composite member of the present disclosure has an excellent heat conductivity due to below-described reasons (a) and (b). The composite member of the present disclosure having an excellent heat conductivity can be suitably used for a heat radiation member of a semiconductor element or the like.

(a) Both the metal phase and the metal layer of the substrate are mainly composed of Ag.

The heat conductivity of Ag is higher than, for example, those of Cu, Al (aluminum), and Mg (magnesium). Therefore, when the main component is Ag, an excellent heat conductivity is attained. Since the content of Cu in the boundary region is small, a decrease in heat conductivity due to an excess of Cu being contained therein can be reduced.

(b) The metal layer is appropriately present on the substrate even when exposed to such a high temperature as described above.

Therefore, a decrease in heat conductivity due to blistering, separation, disappearance or the like of the metal layer is unlikely to occur.

(2) As an example of the composite member of the present disclosure, the boundary region includes one or more elements selected from Ti, Cr, V, Nb, Zr, and Ta, and a content of the one or more elements in the boundary region is more than or equal to 0.1 atomic % and less than or equal to 2.0 atomic % when a composition of the boundary region is assumed to be 100 atomic %.

The metal layer in which the content of the above-described specific element(s) in the boundary region with the substrate falls within the above-described range can be produced, for example, by using the brazing material including the above-described specific element(s). The specific element(s) can improve wettability of the non-metal phase with respect to a metal in a molten state. The specific element(s) in the brazing material serve to attain excellent wetting between the brazing material in the molten state and the non-metal phase in the substrate, with the result that the substrate and the metal layer can be adhered to each other. Since the adhesion between the substrate and the metal layer is excellent, the phenomenon such as the blistering, separation, or disappearance of the metal layer is less likely to occur even when exposed to the above-described high temperature. Therefore, the above-described embodiment attains a more excellent heat resistance. Further, the specific element(s) in the brazing material remains in the boundary region. When the content of the specific element(s) in the boundary region is less than or equal to 2.0 atomic %, a decrease in heat conductivity due to an excess of the specific element(s) being contained therein can be reduced. In this respect, the above-described embodiment also attains an excellent heat conductivity.

(3) As an example of the composite member of the present disclosure, a thickness of the metal layer is more than or equal to 20 μm and less than or equal to 200 μm.

When the thickness of the metal layer is more than or equal to 20 μm, the metal layer is likely to have a smooth surface. Therefore, in the above-described embodiment, when used for a heat radiation member of a semiconductor element or the like, voids are unlikely to be present between the composite member and a package member or the like. When the thickness of the metal layer is less than or equal to 200 μm, a decrease in heat conductivity due to the metal layer being thick can be reduced. In these respects, the above-described embodiment attains an excellent heat conductivity. Moreover, when the thickness of the metal layer is less than or equal to 200 μm, the composite member can be thinned in thickness.

(4) As an example of the composite member of the present disclosure, a surface roughness Ra of the metal layer is less than or equal to 2.0 μm.

The surface of the metal layer in the above-described embodiment is smooth. Therefore, in the above-described embodiment, when used for a heat radiation member of a semiconductor element or the like, voids are unlikely to be present between the composite member and a package member. In this respect, the above-described embodiment attains an excellent heat conductivity.

(5) As an example of the composite member of the present disclosure, a content of Cu in a surface of the metal layer is less than or equal to 1.0 atomic % when a composition of the surface is assumed to be 100 atomic %.

In the above-described embodiment, even when the content of Cu in the boundary region of the metal layer with the substrate is in a range of less than or equal to 20 atomic % with respect to the total content of Ag and Cu, the content of Cu in the surface of the metal layer is very low. Preferably, substantially no Cu is included in the surface of the metal layer. In such an embodiment, the metal layer does not contain an excess of Cu, and a decrease in heat conductivity due to the excess of Cu being contained therein is likely to be reduced. Therefore, the above-described embodiment attains an excellent heat conductivity.

DETAILS OF EMBODIMENTS OF THE PRESENT DISCLOSURE

Hereinafter, the embodiments of the present disclosure will be specifically described with reference to the figures. In the figures, the same reference characters denote the elements having the same designations.

Figure 2:
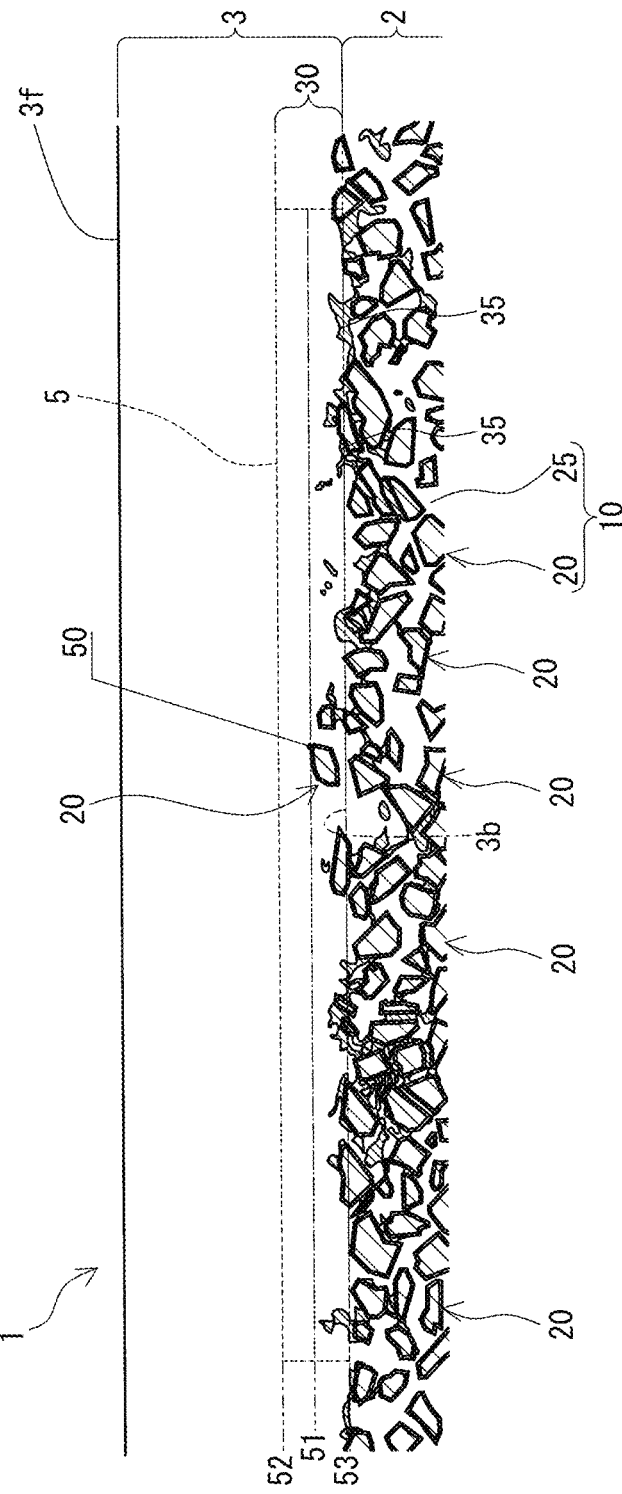
FIG. 2 is an explanatory diagram illustrating a boundary region of a metal layer in the composite member according to the embodiment.

Each of FIGS. 1 and 2 is a partial cross sectional view schematically showing the vicinity of a metal layer 3 in a composite member 1. This cross sectional view is obtained by cutting composite member 1 along a plane parallel to the thickness direction of a substrate 2. The thickness direction of substrate 2 corresponds to a direction in which substrate 2 and metal layer 3 are layered. In FIGS. 1 and 2, the thickness direction of substrate 2 corresponds to the upward/downward direction of the plane of sheet.

In FIGS. 1 and 2, for ease of understanding, a coating layer 23 provided on each coated grain 21 (an exemplary non-metal phase 20) is shown to be thick but is actually very thin. Moreover, a boundary 3b between substrate 2 and metal layer 3 is represented by a straight line in FIG. 1, but an actual boundary therebetween is not represented by a clear straight line. A portion extracted by a below-described method is schematically shown as boundary 3b in FIG. 1.

In FIG. 2, hatchings for a metal phase 25 and metal layer 3 are omitted for clarity of boundary region 30.

[Composite Member]

Composite member 1 of the embodiment will be described mainly with reference to FIG. 1.

(Overview)

As shown in FIG. 1, composite member 1 of the embodiment includes substrate 2 and metal layer 3 that covers at least a portion of a surface of substrate 2. Substrate 2 is composed of a composite material 10 including a non-metal phase 20 and a metal phase 25.

Particularly, in composite member 1 of the embodiment, each of metal phase 25 and metal layer 3 of substrate 2 is composed of a specific metal. Further, the specific metal is included in a boundary region 30 of metal layer 3 with substrate 2. Specifically, each of the metal included in metal phase 25 and the metal included in metal layer 3 is mainly composed of Ag. A ratio of the content of Cu to the total content of Ag and Cu in boundary region 30 of metal layer 3 with substrate 2 is less than or equal to 20 atomic %.

Boundary region 30 will be described with reference to FIG. 2.

As shown in FIG. 2, a cross section of composite member 1 is taken along a plane along the thickness direction of substrate 2. As shown in FIG. 2, the cross section is preferably taken such that a surface 3f of metal layer 3 is substantially parallel to the horizontal direction.

In the cross section, in non-metal phase 20 in composite material 10 of substrate 2, a position closest to surface 3f of metal layer 3 (hereinafter, this position is referred to as "reference point 50") is determined. In FIG. 2, reference point 50 of non-metal phase 20 is indicated by a black circle mark.

Next, a horizontal line 51 extending through reference point 50 is drawn.

Next, a straight line 52 extending through a position located above reference point 50 by 15 μm and parallel to horizontal line 51 is drawn along the thickness direction of substrate 2. Moreover, a straight line 53 extending through a position below reference point 50 by 15 μm and parallel to horizontal line 51 is drawn along the thickness direction of substrate 2.

Straight line 53 below horizontal line 51 is defined as boundary 3b between substrate 2 and metal phase 25. A region from boundary 3b (lower straight line 53) to upper straight line 52, i.e., a region having a thickness of 30 μm is defined as boundary region 30.

It should be noted that the straight line extending through the position above reference point 50 by 15 μm may be unable to be drawn. For example, in some cases, the thickness of metal layer 3 is small with respect to reference point 50, and surface 3f of metal layer 3 is located at a point away from reference point 50 by less than 15 μm. In such cases, surface 3f of metal layer 3 is regarded as upper straight line 52. That is, substantially the whole of metal layer 3 is regarded as boundary region 30.

Hereinafter, each of the components will be described in detail.

(Substrate)

As substrate 2 provided in composite member 1, a substrate composed of composite material 10 mainly composed of non-metal phase 20 and metal phase 25 can be appropriately used.

<Non-Metal Phase>

<<Composition>>

Non-metal phase 20 is composed of a nonmetallic inorganic material. Examples of the nonmetallic inorganic material include: various types of ceramics; a carbon material such as diamond; and the like. Examples of the ceramics include metal or non-metal oxides, carbides, nitrides, borides, chlorides, silicides, and the like. The other examples of the nonmetallic inorganic material include silicon-based materials such as Si and $Si_3N_4$.

Examples of the oxides include $Al_2O_3$ (aluminum oxide), MgO (magnesium oxide), CaO (calcium oxide), $ZrO_2$ (zirconium oxide), $Y_2O_3$ (yttrium oxide), and the like.

Examples of the carbides include SiC (silicon carbide), $B_4C$ (boron carbide), and the like.

Examples of the borides include $MgB_2$ (magnesium boride) and the like.

Examples of the nitrides include h-BN (hexagonal boron nitride), c-BN (cubic boron nitride), AlN (aluminum nitride), $Mg_3N_2$ (magnesium nitride), and the like.

Examples of the chlorides include $MgCl_2$ (magnesium chloride), $CaCl_2$) (calcium chloride), and the like.

Examples of the silicides include $Mg_2Si$ (magnesium silicide) and the like.

Examples of the carbon-based material include diamond, graphite, a carbon nanotube, a carbon fiber, and the like.

Non-metal phase 20 may include one nonmetallic inorganic material or a plurality of nonmetallic inorganic materials.

Particularly, when non-metal phase 20 includes diamond, composite member 1 can have an excellent heat conductivity. This is because diamond typically has a high heat conductivity of more than or equal to 1000 W/m·K. This is also because diamond has substantially no anisotropy with regard to heat conduction.

<<Form of Presence>>

Non-metal phase 20 includes grains as shown in FIG. 1. Non-metal phase 20 may be entirely constituted of grains. The plurality of grains included in non-metal phase 20 are dispersed in metal phase 25. Alternatively, non-metal phase 20 may include a porous body (not shown) having a three-dimensional mesh structure. The porous body is typically a sintered material. In this case, metal phase 25 is present in pores of the porous body of silicon carbide or the like.

Non-metal phase 20 may include coated grains 21 as shown in FIG. 1. Each of coated grains 21 includes: a core grain 22 composed of the nonmetallic inorganic material; and a coating layer 23 that covers at least a portion, preferably substantially the whole, of a surface of core grain 22.

An exemplary coated grain 21 is a coated grain in which core grain 22 is a diamond grain and coating layer 23 is composed of a carbide. When the carbide layer is provided on the surface of the diamond grain, wettability of coated grain 21 with respect to a metal in a molten state can be improved in a production process. This makes it possible to suppress generation of a non-infiltration portion, thereby excellently attaining densification and compositing thereof. Therefore, composite material 10 can be dense with the diamond grain and metal phase 25 being adhered to each other. Substrate 2 composed of such a composite material 10 has an excellent heat conductivity and is therefore preferable.

Examples of a constituent material of the above-described carbide layer include a carbide including one or more elements selected from Si, Ti (titanium), Zr, Hf (hafnium), Ta (tantalum), and Cr (chromium). Specific examples thereof include SiC, TiC, ZrC, HfC, TaC, and $Cr_3C_2$. C (carbon) in the carbide is typically originated from diamond. Therefore, the diamond grain and the carbide layer are adhered to each other. Also in this respect, an excellent heat conductivity is attained.

Another exemplary coated grain 21 is a coated grain in which core grain 22 is composed of a ceramic such as SiC and coating layer 23 is composed of an oxide such as silicon oxide. Coated grains 21 in which the composition of at least one of core grain 22 and coating layer 23 is different may be included. When non-metal phase 20 includes the above-described porous body, the above-described coating layer composed of a carbide, an oxide, or the like may be provided on at least a portion of a surface of the porous body.

<<Size>>

When non-metal phase 20 includes grains, the average grain size of the grains (including coated grains 21 described above) is, for example, more than or equal to 1 μm and less than or equal to 300 μm.

When the average grain size is more than or equal to 1 μm, powder grain boundaries between the grains of non-metal phase 20 in composite material 10 can be reduced. Composite member 1 including substrate 2 composed of composite material 10 having a small number of powder grain boundaries has an excellent heat conductivity. As the average grain size is larger, the powder grain boundaries are more reduced, thereby attaining an excellent heat conductivity. When improvement in heat conductivity or the like is desired, the average grain size may be more than or equal to 5 μm, more than or equal to 10 μm, more than or equal to 15 μm, or more than or equal to 20 μm.

When the average grain size is less than or equal to 300 μm, unevenness of the surface of substrate 2 is likely to be small. Even when polishing or the like is performed in the production process, recesses resulting from falling of grains of non-metal phase 20 are likely to be made small. Therefore, substrate 2 can have an excellent surface property. Further, substrate 2 is excellent in workability for polishing or the like. Further, substrate 2 can be readily thinned. As the average grain size is smaller, the unevenness of the surface of substrate 2 is more likely to be small. Further, substrate 2 is excellent in workability. Further, substrate 2 can be readily thinned. When improvement in surface property, improvement in workability, thinning, or the like is desired, the average grain size may be less than or equal to 290 μm, less than or equal to 280 μm, less than or equal to 270 μm, or less than or equal to 260 μm. Further, the average grain size may be less than or equal to 100 μm.

Relatively fine grains and relatively coarse grains may be mixed as long as the average grain size falls within a range of more than or equal to 1 μm and less than or equal to 300 μm. In this case, densification is likely to be attained in the production process, with the result that substrate 2 having a high relative density is likely to be obtained. Composite member 1 including such a dense substrate 2 has an excellent heat conductivity.

The average grain size may be measured, for example, by extracting grains of non-metal phase 20 from substrate 2, and measuring the median size of the grains using a commercially available analysis device. Non-metal phase 20 may be extracted by, for example, selectively dissolving and removing metal phase 25 using an acid or the like.

<<Content>>

The content of non-metal phase 20 (total content when a plurality of nonmetallic inorganic materials are included) is, for example, more than or equal to 40 volume % and less than or equal to 90 volume %.

When the content is more than or equal to 40 volume %, composite material 10 can have an excellent heat conductivity. Further, the linear expansion coefficient of composite material 10 is readily made smaller than that of metal phase 25. Composite member 1 including substrate 2 composed of such a composite material 10 has an excellent heat conductivity and also has a linear expansion coefficient that excellently matches with the linear expansion coefficients of a semiconductor element and peripheral devices thereof. Therefore, composite member 1 can be suitably used for a heat radiation member of a semiconductor element. As the content is larger, the heat conductivity is more excellent. When improvement in heat conductivity or the like is desired, the content may be more than or equal to 45 volume %, more than or equal to 50 volume %, more than or equal to 55 volume %, or more than or equal to 60 volume %.

When the above-described content is less than or equal to 90 volume %, composite material 10 includes metal phase 25 to some extent. Therefore, the linear expansion coefficient of composite material 10 can be prevented from being too small due to the amount of non-metal phase 20 being too large. When non-metal phase 20 includes grains, the grains can be securely joined to one another by metal phase 25. Further, when the above-described content is less than or equal to 90 volume %, a metal in the molten state is readily infiltrated in non-metal phase 20 serving as the source material in the production process. This makes it possible to suppress generation of a non-infiltration portion, thereby excellently attaining densification and compositing thereof. When the securing of metal phase 25, densification, excellent compositing, or the like is desired, the content may be less than or equal to 85 volume %, or less than or equal to 80 volume %.

Specifications such as the shapes, sizes, and contents of the grains (including coated grains 21) of non-metal phase 20 and the porous body can be appropriately selected. The specifications of the grains are typically substantially the same as the specifications of the source material powder. The specifications of the porous body are typically substantially the same as the specifications of the sintered material used as its source material. The specifications of the source material may be selected to attain a predetermined specification of non-metal phase 20 in composite material 10.

<Metal Phase>

Metal phase 25 will be collectively described in the below-described section regarding the composition of metal layer 3.

(Metal Layer)

Metal layer 3 included in composite member 1 covers at least a portion of the surface of substrate 2. Typically, metal layer 3 covers substantially the whole of a front surface of substrate 2 or covers substantially the whole of each of front and rear surfaces of substrate 2. By covering the surface of substrate 2 with metal layer 3, the unevenness of the surface of substrate 2 is leveled. As a result, composite member 1 can have a smooth surface (here, surface 3f of metal layer 3). In addition to the function of attaining the smooth surface of composite member 1, metal layer 3 has the following functions:

(A) In the case where composite member 1 is used for a heat radiation member of a semiconductor element or the like, composite member 1 can be used as a underlying layer when a package member (for example, an insulating substrate) or the like is joined.

(B) Substrate 2 is mechanically protected or is protected from a surrounding environment.

(C) An improved appearance is attained.

<Composition>

Each of the constituent metal of metal phase 25 in composite material 10 of substrate 2 and the constituent metal of metal layer 3 that covers the surface of substrate 2 is mainly composed of Ag. Here, the metal mainly composed of Ag refers to a silver-based alloy having a Ag content of more than or equal to 80 atomic %, or refers to pure silver.

The pure silver herein contains more than or equal to 99.9 atomic % of Ag and a remainder of inevitable impurity.

The silver-based alloy herein contains less than or equal to 20 atomic % of an additive element in total and a remainder of Ag and inevitable impurity. The silver-based alloy does not include a binary eutectic alloy of Ag and Cu (the content of Cu: about 40 atomic %) or an alloy that is based on the eutectic alloy.

Examples of the additive element of the silver-based alloy include Si, Ti, Zr, Hf, Ta, Cr, and the like. Each of the silver-based alloys including these additive elements has a melting temperature of more than or equal to 830° C.

Boundary region 30 of metal layer 3 with substrate 2 is mainly composed of Ag and has the content of Cu in a predetermined range. Specifically, the ratio of the content of Cu to the total content of Ag and Cu is less than or equal to 20 atomic % when the total content of Ag and Cu in boundary region 30 is assumed to be 100 atomic %. In such a boundary region 30, the ratio of the content of Cu is sufficiently small. Hence, boundary region 30 does not substantially include the eutectic alloy or the like. Preferably, the eutectic alloy or the like is not substantially included in the entire region of metal layer 3 from boundary 3b with substrate 2 to surface 3f. Therefore, even when composite member 1 is exposed to a temperature of more than the melting temperature (for example, 780° C.) of the eutectic alloy or the like, for example, a high temperature of 800° C. or 830° C., occurrence of the phenomenon can be prevented, such as blistering, separation, or disappearance of metal layer 3 due to melting of the eutectic alloy or the like.

The expression "the eutectic alloy or the like is not substantially included" herein encompasses not only a case where the content of Cu is less than or equal to 20 atomic % as described above but also a case where a below-described small content of Cu is included. For example, an amount of the eutectic alloy or the like can be permitted to be included as long as the phenomenon such as the blistering, separation, or disappearance of metal layer 3 does not substantially occur due to melting of the eutectic alloy or the like when heated to 800° C. or 830° C.

Metal layer 3 in which the ratio of the content of Cu in boundary region 30 with substrate 2 falls within the above-described range can be produced, for example, as follows. A metal member mainly composed of Ag is prepared as a source material of metal layer 3. Examples of the metal member include a metal foil, a metal plate, a metal strip, and the like. Further, a brazing material for joining the metal member to substrate 2 is prepared. Examples of the brazing material include a silver-based alloy including the eutectic alloy of Ag and Cu. Substrate 2 and the metal member are joined by the brazing material. This joining may be performed under a condition that diffusion of Cu in the brazing material is promoted. Alternatively, heat treatment for diffusing Cu may be additionally performed after joining substrate 2 and the metal member. The joining condition and the heat treatment condition may be adjusted such that the ratio of the content of Cu falls within the above-described range. Details of the conditions will be described later.

<<Ag>>

As the content of Ag is larger in each of the constituent metals of metal phase 25 and metal layer 3, Cu in the brazing material is more likely to be diffused in metal phase 25 and in the metal member serving as the source material of metal layer 3 in the production process. Particularly, when the content of Ag in each of the constituent metal of metal phase 25 and the constituent metal of metal layer 3 is more than or equal to 90 atomic %, the amount of Ag is large and Cu is more likely to be diffused. As a result, the ratio of the content of Cu in boundary region 30 of metal layer 3 is likely to be small. Even when composite member 1 is exposed to a temperature of more than the melting temperature of the eutectic alloy or the like, the blistering, melting, separation, or the like of metal layer 3 due to melting of the eutectic alloy or the like can be securely prevented. Therefore, composite member 1 can have an excellent heat resistance. Further, even when exposed to such a high temperature as described above, metal layer 3 is present appropriately, thereby attaining an excellent heat conductivity. Since the content of Ag is large, an excellent heat conductivity is attained. As the content of Ag is larger, more excellent heat resistance and heat conductivity are attained. When excellent heat resistance, improvement in heat conductivity, or the like is desired, the content of Ag may be more than or equal to 92 atomic %, or more than or equal to 95 atomic %.

When at least one, preferably both, of metal phase 25 and metal layer 3 (excluding boundary region 30) is composed of pure silver, the content of Ag is sufficiently large. Such a composite member 1 has more excellent heat resistance and heat conductivity due to the reasons described above.

<<Cu>>

As described above, the content of Cu in boundary region 30 of metal layer 3 with substrate 2 is less than or equal to 20% in atomic ratio with respect to the total content of Ag and Cu.

In the case where the ratio of the content of Cu is less than or equal to 20 atomic % when the total content of Ag and Cu is assumed to be 100 atomic %, the ratio of the content of Cu to the total content of Ag and Cu is sufficiently small in boundary region 30. It can be said that such a boundary region 30 does not substantially include the eutectic alloy or the like. Therefore, even when composite member 1 is exposed to a temperature of more than the melting temperature of the eutectic alloy or the like, the blistering, melting, separation, or the like of metal layer 3 due to melting of the eutectic alloy or the like can be reduced. Since metal layer 3 can be appropriately maintained, composite member 1 can have an excellent heat resistance. As the ratio of the content of Cu is smaller, the eutectic alloy or the like can be prevented from being contained therein. Therefore, when excellent heat resistance or the like is desired, the ratio of the content of Cu may be less than or equal to 18 atomic %, less than or equal to 16 atomic %, or less than or equal to 15 atomic %.

Even when the brazing material including Cu is used in the production process, Cu can be diffused by adjusting the composition of the source material, the production condition, or the like. As a result, the ratio of the content of Cu in boundary region 30 can be reduced. For example, the ratio of the content of Cu may be close to 0 atomic %. However, when the ratio of the content of Cu is less than 2.0 atomic %, a process time for diffusing Cu becomes long, thus resulting in decreased productivity. When improvement in productivity or the like is desired, the ratio of the content of Cu may be more than or equal to 2.0 atomic %. Further, the ratio of the content of Cu may be more than or equal to 3.0 atomic %, more than or equal to 4.0 atomic %, or more than or equal to 5.0 atomic %. It should be noted that Cu in boundary region 30 is considered to be typically originated from the brazing material used in the production process.

At least part of Cu in boundary region 30 of metal layer 3 with substrate 2 may be precipitated in boundary region 30. That is, boundary region 30 may include a precipitate 35 composed of Cu. When Cu is precipitated solely in boundary region 30, boundary region 30 is not melted even when exposed to a high temperature as described above. As a result, blistering, separation, disappearance, or the like of metal layer 3 due to Cu being precipitated solely does not occur. A precipitate 35 composed of Cu and present in contact with non-metal phase 20 as shown in FIG. 1 may be included.

The content of Cu in surface 3f of metal layer 3 is preferably very small. Quantitatively, the content of Cu in surface 3f of composite member 1 is preferably less than or equal to 1.0 atomic % when the composition of surface 3f is assumed to be 100 atomic %. When the content of Cu in surface 3f is less than or equal to 1.0 atomic %, it can be said that an excess of Cu is not included in metal layer 3 as a whole. Therefore, a decrease in heat conductivity due to an excess of Cu being contained can be reduced and an excellent heat conductivity is attained. When improvement in heat conductivity or the like is desired, the content of Cu may be less than or equal to 0.5 atomic %, or less than or equal to 0.1 atomic %. More preferably, the content of Cu is 0 atom %, i.e., surface 3f includes no Cu. As described above, Cu can be diffused by adjusting the composition of the source material, the production condition, and the like. For example, the content of Cu in surface 3f of metal layer 3 can be close to 0 atomic %

<<Other Elements>>

Boundary region 30 of metal layer 3 with substrate 2 may include one or more elements (hereinafter, referred to as "first element(s)") selected from Ti, Cr, V (vanadium), Nb (niobium), Zr, and Ta. In this case, when the composition of boundary region 30 is assumed to be 100 atomic %, the content of the first element(s) in boundary region 30 (total content when a plurality of first elements are included) is more than or equal to 0.1 atomic % and less than or equal to 2.0 atomic %. Metal layer 3 in which the content of the first element(s) in boundary region 30 falls within the above-described range can be produced by using, for example, the above-described brazing material including the first element(s). The first element(s) can improve wettability of non-metal phase 20 with respect to a metal in a molten state, for example, the brazing material in the molten state. The first element(s) in the brazing material serve to attain excellent wetting between the brazing material in the molten state and non-metal phase 20 in composite material 10 of substrate 2. As a result, substrate 2 and the metal member serving as the source material of metal layer 3 can be adhered to each other. Therefore, in composite member 1, the adhesion between substrate 2 and metal layer 3 can be excellent. Particularly among the first elements, Ti and Cr are likely to attain the above-described wettability improvement effect. Further, among the first elements, Ti is preferable because the above-described wettability improvement effect can be more likely to be attained.

When the content of the first element(s) is more than or equal to 0.1 atomic %, the adhesion between substrate 2 and metal layer 3 is excellent due to the wettability improvement effect of non-metal phase 20 being attained by the first element(s). As the content of the first element(s) is larger, the wettability of non-metal phase 20 is more securely improved. This leads to excellent adhesion between substrate 2 and metal layer 3. When excellent adhesion or the like is desired, the content of the first element(s) may be more than or equal to 0.3 atomic %, or may be 0.5 atomic %.

The first element(s) in the brazing material remain in boundary region 30. However, as long as the content of the first element(s) in boundary region 30 is less than or equal to 2.0 atomic %, a decrease in heat conductivity due to an excess of the first element(s) being contained can be reduced. As the content of the first element(s) is smaller, the decrease in heat conductivity due to the first element(s) being contained is more likely to be reduced. Therefore, an excellent heat conductivity is attained. When improvement in heat conductivity or the like is desired, the content of the first element(s) may be less than or equal to 1.8 atomic %, or less than or equal to 1.5 atomic %. When the content of the first element(s) is less than or equal to 1.0 atomic %, a more excellent heat conductivity is attained.

It should be noted that regarding the content of the first element(s) in boundary region 30, an element originated from non-metal phase 20 is permitted to be included. Here, boundary region 30 includes reference point 50 described above. At least a portion of non-metal phase 20 having reference point 50 is included in boundary region 30. At least a portion of non-metal phase 20 present near non-metal phase 20 having reference point 50 is also likely to be included in boundary region 30. For example, when coated grains 21 each including coating layer 23 composed of a carbide such as TiC, TaC, or $Cr_3C_2$ are included as such a non-metal phase 20, boundary region 30 may include a first element such as Ti originated from non-metal phase 20.

Boundary region 30 of metal layer 3 with substrate 2 may include Ag, Cu, and element(s) (hereinafter, referred to as "second element(s)") other than the first element(s). Examples of the second element(s) include Sn (tin), Zn (zinc), In (indium), and the like. The total content of the second element(s) is, for example, less than or equal to 3.0 atomic %.

The types and contents of the elements included in boundary region 30 of metal layer 3 with substrate 2, and the content of Cu in surface 3f of metal layer 3 mainly depend on the compositions of the source materials and the production conditions such as the joining condition and the heat treatment condition in the production process. The compositions of the source materials include the composition of the brazing material, the composition of the metal member serving as the source material of metal layer 3, and the composition of composite material 10 of substrate 2. The compositions of the source materials and the production conditions are adjusted such that the contents of Cu, the first element(s), and the like fall within the above-described ranges.

<Surface Roughness>

Metal layer 3 preferably has smooth surface 3f. When surface 3f is smooth, voids are unlikely to be present between metal layer 3 and a package member or the like when composite member 1 is used for a heat radiation member of a semiconductor element or the like. Therefore, a decrease in heat conductivity due to voids can be reduced. Particularly, surface roughness Ra of metal layer 3 is preferably less than or equal to 2.0 μm. When surface roughness Ra of metal layer 3 is less than or equal to 2.0 μm, surface 3*f* of metal layer 3 is smooth and a decrease in heat conductivity due to the voids is unlikely to occur. As surface roughness Ra is smaller, the decrease in heat conductivity due to the voids is less likely to occur. Therefore, an excellent heat conductivity is attained. Further, when surface 3*f* is smooth, plating is readily provided when plating is further provided on metal layer 3. Particularly, a plating layer having a uniform thickness is readily formed. When improvement in heat conductivity or the like is desired, surface roughness Ra may be less than or equal to 1.8 μm, or less than or equal to 1.5 μm. Preferably, when surface roughness Ra is less than or equal to 1.0 μm or less than or equal to 0.8 μm, the voids are further less likely to be present. It should be noted that surface roughness Ra refers to an arithmetic mean roughness.

When surface roughness Ra is too small, productivity in producing metal layer 3 and polishing workability are decreased. In consideration of improvement in productivity and the like, it is considered to employ a surface roughness Ra of more than or equal to 0.01 μm or more than or equal to 0.02 μm for ease of utilization.

<Thickness>

The thickness of metal layer 3 is, for example, more than or equal to 20 μm and less than or equal to 200 μm. Here, the thickness of metal layer 3 is defined as a size thereof from boundary 3*b* between substrate 2 and metal layer 3 along the thickness direction of substrate 2.

The thickness of metal layer 3 mainly depends on the thickness of the metal member used in the production process. Therefore, when the thickness of metal layer 3 is more than or equal to 20 μm, it can be said that a metal member having a thickness of more than or equal to 20 μm is used in the production process. When the thickness of the metal member is more than or equal to 20 μm, the surface of the metal member is readily made smooth. When the metal member having a smooth surface is used, metal layer 3 readily has smooth surface 3*f*. Therefore, when the thickness of metal layer 3 is more than or equal to 20 μm, metal layer 3 having smooth surface 3*f* is readily formed. When such a composite member 1 is used for a heat radiation member of a semiconductor element or the like, voids are unlikely to be present between metal layer 3 and a package member or the like. Therefore, a decrease in heat conductivity due to voids can be reduced and an excellent heat conductivity is attained. As metal layer 3 is thicker, surface 3*f* is more readily made smooth even when non-metal phase 20 is large, with the result that a metal member having smooth surface 3*f* is readily produced. As a result, excellent productivity is attained with regard to composite member 1. When improvement in smoothness of surface 3*f* or the like is desired, the thickness of metal layer 3 may be more than or equal to 25 μm, more than or equal to 30 μm, more than or equal to 50 μm, or more than or equal to 100 μm.

When the thickness of metal layer 3 is less than or equal to 200 μm, a decrease in heat conductivity due to metal layer 3 having a thick thickness can be reduced, and an excellent heat conductivity is attained. When the thickness of metal layer 3 is less than or equal to 200 μm, composite member 1 can be thinned. When improvement in heat conductivity, thinning, or the like is desired, the thickness of metal layer 3 may be less than or equal to 180 μm, or less than or equal to 150 μm.

When metal layers 3 are provided on both the front and rear surfaces of substrate 2, the total thickness of metal layers 3 is preferably more than or equal to 40 μm and less than or equal to 400 μm.

The thickness of the metal member may be adjusted to attain a predetermined thickness of metal layer 3.

<Other Layer>

Composite member 1 may further include another metal layer (not shown) on metal layer 3 mainly composed of Ag. That is, composite member 1 may include a metal layer having a multilayer structure, and metal layer 3 may be disposed directly on substrate 2. Examples of a constituent metal of the metal layer other than metal layer 3 include nickel, a nickel alloy, copper, a copper alloy, gold, a gold alloy, and the like. The nickel, copper, and gold herein are pure metals. The metal layer other than metal layer 3 may be formed by electroplating or the like with electric conduction being provided by metal layer 3, for example. When electroplating is used, the metal layer having a multilayer structure can be formed readily and inexpensively. Therefore, excellent productivity is attained.

(Outer Shape and Size)

The planar shape, size (thickness and planar area) and the like of composite member 1 can be appropriately selected in accordance with a purpose of use or the like of composite member 1. For example, when composite member 1 is used for a heat radiation member of a semiconductor element, the planar shape of substrate 2 may be a rectangular shape. The planar area of substrate 2 may be such an area that a component to be mounted such as a semiconductor element can be placed. Further, in this purpose of use, a smaller thickness of composite member 1 is preferable because heat of the semiconductor element is more likely to be transmitted to an installed object such as a cooling device. The thickness of composite member 1 refers to the total thickness of the thickness of substrate 2 and the thickness of metal layer 3. The thickness of metal layer 3 is as described above. Preferably, when the thickness of substrate 2 is less than or equal to 10 mm or less than or equal to 5 mm, substrate 2 has an excellent heat conductivity because substrate 2 is a thin plate. For ease of utilization, the thickness of substrate 2 is more than or equal to 0.2 mm.

(Purpose of Use)

Examples of the semiconductor device including composite member 1 of the embodiment as a heat radiation member include various types of electronic devices. Specific examples thereof include a high-frequency power device (for example, an LDMOS), a semiconductor laser device, a light emitting diode device, and the like. The other examples thereof include central processing units (CPU), graphics processing units (GPU), high electron mobility transistors (HEMT), chip sets, memory chips, and the like of various types of computers. Particularly, composite member 1 is suitable for a heat radiation member of a semiconductor element that generates a large amount of heat, such as an SiC device or a GaN device.

[Method of Producing Composite Member]

Composite member 1 of the embodiment can be produced by, for example, a production method including the following preparation step and the following joining step.

(Preparation Step) A step of preparing substrate 2 composed of composite material 10 including non-metal phase 20 and metal phase 25 mainly composed of Ag, and the metal member (not shown) mainly composed of Ag.

(Joining Step) A step of joining substrate 2 and the metal member by the brazing material (not shown) including Ag and Cu.

Further, a step (heat treatment step) of performing heat treatment after joining substrate 2 and the metal member may be provided.

Hereinafter, each of the steps will be described.

(Preparation Step)

As substrate 2 prepared in the preparation step, a known substrate can be used. Alternatively, substrate 2 may be produced by a known production method. For example, a substrate composed of a composite material of diamond and silver in PTL 1 can be used as substrate 2. Alternatively, a method of producing the substrate in PTL 1 can be used.

Examples of the metal member prepared in the preparation step include a metal foil, a metal strip, a metal plate, and the like, each of which is mainly composed of Ag. That is, a metal member composed of pure silver or a metal member composed of the above-described silver-based alloy is prepared. The thickness of metal layer 3 will be substantially the same as the thickness of the metal member such as the metal foil. Therefore, the thickness of the metal member is adjusted to attain a predetermined thickness of metal layer 3. Further, the width, planar area, and the like of the metal member are adjusted so as to cover a predetermined region in the surface of substrate 2.

(Joining Step)

In the joining step, a brazing material including Ag and Cu is first prepared. Particularly, an eutectic alloy-based brazing material is used as the brazing material. The brazing material preferably includes the above-described first element(s) such as Ti. This is because the wettability of non-metal phase 20 can be improved with respect to the brazing material or the like in the molten state as described above. Further, the brazing material may include the above-described second element(s) in addition to the first element(s). An exemplary composition of the brazing material is a silver-based alloy including more than or equal to 25 mass % and less than or equal to 35 mass % of Cu (assuming that the silver-based alloy is 100 mass %; the same applies to the description below). A more specific composition of the brazing material is a silver-based alloy including more than or equal to 25 mass % and less than or equal to 35 mass % of Cu, more than or equal to 1.0 mass % and less than or equal to 3.0 mass % of Ti, and more than or equal to 62 mass % and less than or equal to 74 mass % of Ag. It can be said that the silver-based alloy including Cu in the above range is an alloy that is based on the eutectic alloy of Ag and Cu. Such a brazing material composed of the silver-based alloy that is based on the eutectic alloy is readily melted and is readily dissolved in metal phase 25 or the like. When such a brazing material is used, substrate 2 including metal phase 25 mainly composed of Ag and the metal member mainly composed of Ag can be excellently joined to each other.

The compositions and production conditions are adjusted such that the ratio of the content of Cu to the total content of Ag and Cu in boundary region 30 of metal layer 3 with substrate 2 becomes less than or equal to 20 atomic % by actively diffusing Cu in the brazing material into metal phase 25 and the metal member. Specifically, each of metal phase 25 of substrate 2 and the metal member serving as the source material of metal layer 3 is mainly composed of Ag. That is, the amount of Cu adjacent to the brazing material is very small and the amount of Ag adjacent to the brazing material is large. Typically, for the metal adjacent to the brazing material, pure silver or a silver-based alloy having a very small content of Cu is employed. Further, in order to diffuse Cu in the brazing material into Ag of each of metal phase 25 and the metal member, the joining condition is adjusted or heat treatment is additionally performed after the joining. By the diffusion of Cu, composite member 1 having substantially no eutectic alloy or the like between substrate 2 and metal layer 3 can be produced.

<Joining Condition>

When only the joining step is performed without performing the heat treatment step described later, the joining condition may be adjusted such that the ratio of the content of Cu to the total content of Ag and Cu in boundary region 30 of metal layer 3 with substrate 2 becomes less than or equal to 20 atomic %.

Here, an exemplary, recommended joining condition for the above-described eutectic alloy-based brazing material is such that a heating temperature is 800° C. and a heating time is 5 minutes. On the other hand, as the joining condition with which the ratio of the content of Cu to the total content of Ag and Cu in boundary region 30 becomes less than or equal to 20 atomic % by diffusing Cu, the following condition may be satisfied, for example.

(Joining Condition)

At least one of setting the heating temperature to be higher than that in the above recommended condition and setting the heating time to be longer than that in the recommended condition is performed.

Examples of the heating temperature higher than that in the recommended condition include a heating temperature of more than or equal to 855° C. and less than or equal to 885° C. A higher heating temperature is preferable because Cu is more readily diffused. When the thickness of the brazing material is comparatively large (for example, more than 100 μm), the heating temperature may be made high within the above range or may be made higher than those in the above range. When the heating temperature in the joining condition is set to such a high temperature, the heating time can be set to be as long as that in the above recommended condition. In other words, the heating time can be short, i.e., can be more than or equal to 1 minute and less than or equal to 10 minutes, particularly about 5 minutes, thus resulting in excellent productivity.

The heating time longer than that in the above recommended condition is not particularly limited, but may be, for example, more than 5 minutes, particularly, more than or equal to 20 minutes or more than or equal to 30 minutes. The holding time herein refers to a period of time during which the temperature is held at the heating temperature, and does not include a temperature increasing process and a temperature decreasing process. When the thickness of the metal member is comparatively large (for example, more than 100 μm), the holding time may be made longer.

As long as the ratio of the content of Cu to the total content of Ag and Cu is less than or equal to 20 atomic %, the joining condition may be such that the heating temperature is a low temperature comparable to or equal to or less than that in the above recommended condition (for example, 780° C. to less than 800° C.) and the holding time may be longer than that in the above recommended condition (for example, more than or equal to 20 minutes, or more than or equal to 30 minutes). However, when the heating temperature during the joining is higher than that in the above-described recommended condition, the heating time can be comparatively short, i.e. can be as short as that in the recommended condition as described above, thus favorably resulting in excellent productivity. Meanwhile, in the case where the joining condition is such that the heating temperature is higher than that in the above-described recommended condition, the holding time is as long as that in the above-described recommended condition, and the heat treatment is not additionally performed, the number of production steps is small, thus favorably resulting in excellent productivity (see a below-described test example 1).

(Heat Treatment Step)

When the heat treatment is additionally performed, the joining condition may be set to be the above-described recommended condition and the heat treatment condition may be adjusted such that the ratio of the content of Cu to the total content of Ag and Cu in boundary region 30 becomes less than or equal to 20 atomic %. Particularly, in this heat treatment, the heating temperature is set to be less than the melting point of the eutectic alloy of Ag and Cu.

Here, after the joining under the above-described recommended condition, the eutectic alloy of Ag and Cu may remain near the boundary between the substrate and the joined metal member. When heated at a temperature of more than 780° C., which is the melting point of the eutectic alloy of Ag and Cu, the eutectic alloy is melted, thus presumably resulting in blistering of the joined metal member or separation of the metal member. In view of this, in this heat treatment, heating is performed at a temperature of less than the melting point of the eutectic alloy. This makes it possible to appropriately form the metal layer while diffusing Cu into the metal phase and the metal member. Specific examples of the heating temperature include 750° C.±20° C. The heating time is, for example, more than or equal to 1 hour. By performing such heat treatment, Cu can be sufficiently diffused, thereby reducing the ratio of the content of Cu in boundary region 30.

(Other Conditions)

The joining condition and the heat treatment condition can be appropriately adjusted in accordance with the composition and thickness of substrate 2, the composition and thickness of the metal member, the composition and thickness of the brazing material, and the like. Further, examples of applied pressure and atmosphere in the joining step include below-described applied pressure and atmosphere. Examples of an atmosphere in the heat treatment step include a below-described atmosphere. In the heat treatment step, pressure may or may not be applied in a below-described manner.

The applied pressure is, for example, about more than or equal to 1 kPa and less than or equal to 100 kPa in an atmosphere during joining. Particularly, when the thickness of the metal member is comparatively large (for example, more than 100 μm), the applied pressure may be made high.

The atmosphere is preferably a non-oxidizing atmosphere. This is because oxidation of substrate 2, the metal member, and the brazing material (particularly, Ti) can be prevented. Examples of the non-oxidizing atmosphere include a vacuum atmosphere, an inert atmosphere, and a reducing atmosphere.

Examples of the vacuum atmosphere include a low-pressure atmosphere having a pressure of less than an atmospheric pressure. The pressure of the atmosphere is, for example, less than or equal to 1 Pa.

Examples of the inert atmosphere include an argon atmosphere, a nitrogen atmosphere, and the like.

Examples of the reducing atmosphere include a hydrogen atmosphere, a mixed atmosphere of a hydrogen gas and an inert gas, a carbon monoxide atmosphere, and the like.

It should be noted that typically, Cu in the brazing material may be once dissolved in Ag in the solid state, and then at least part of the Cu may be precipitated in a cooling process of the joining step or the heat treatment step. In this case, the precipitated Cu exists as precipitate 35 in boundary region 30 of metal layer 3 with substrate 2 (FIG. 1).

[Main Function and Effect]

Composite member 1 of the embodiment has an excellent heat resistance. Particularly, even when composite member 1 of the embodiment is heated to a high temperature such as 800° C. or 830° C., metal layer 3 can be appropriately maintained while preventing occurrence of the phenomenon such as the blistering, separation, or disappearance of metal layer 3. This is because substantially no alloy having a low melting point, i.e., alloy that is to be melted at the high temperature, is present between substrate 2 and metal layer 3. This point will be specifically described in the following test example.

Test Example 1

A composite member was produced which included: a substrate composed of a composite material including a diamond phase and a silver phase; and a metal layer that covers a surface of the substrate. A composition in the vicinity of an interface of the metal layer with the substrate was examined.

In this test, a metal foil and a brazing material were used to form the metal layer. Details are as follows.

(Substrate)

The prepared substrate of the composite material was produced based on PTL 1. A diamond phase, which serves as a non-metal phase, is constituted of coated grains including: diamond grains; and coating layers that cover the diamond grains. Each of the coating layers is composed of TiC. A silver phase, which serves as a metal phase, is composed of pure silver. The content of Ag in the metal phase is more than or equal to 99.9 atomic %. The substrate herein is a rectangular flat plate member. The thickness of the substrate is 1.2 mm.

In each of samples No. 3 to No. 5, No. 100, and No. 101, a substrate composed of a composite material including comparatively fine diamond grains was used. Specifically, the average grain size of the diamond grains (here, the coated grains; the same applies to the description below) is 20 μm. The content of the diamond grains is 60 volume %.

In sample No. 1, a substrate composed of a composite material including comparatively coarse diamond grains was used. Specifically, the average grain size of the diamond grains is 90 μm. The content of the diamond grains is 60 volume %.

In sample No. 2, a substrate composed of a composite material including fine and coarse diamond grains was used. Specifically, the composite material includes: diamond grains (coarse grains) having an average grain size of 45 μm; and diamond grains (fine grains) having an average grain size of 5 μm. A mixing ratio of the coarse grains and the fine grains is 7:3 in volume ratio. The total content of the diamond grains is 70 volume %.

It should be noted that each of the average grain sizes of the diamond grains is a median grain size. The median size was measured using a commercially available grain image analysis device. Examples of the commercially available grain image analysis device include Morphologi G3 (manufactured by Malvern Instruments).

(Brazing Material)

In each of the samples, a sheet material that is based on an eutectic alloy of Ag and Cu was used for the brazing material. A specific composition of the brazing material is as follows: 30 mass % of Cu, 1.5 mass % of Ti, and 3.0 mass % of Sn are contained, and a remainder is Ag and an inevitable impurity (the content of Ag: more than or equal to 65 mass %). The melting temperature of the brazing material is 780° C. The thickness of the sheet material is selected from a range of 25 μm to 50 μm. The thickness (μm) of the brazing material of each of the samples is shown in Table 1.

than the load on the sample in which the thickness of metal foil 62 was less than 100 μm.

TABLE 1

| | Substrate | | | | | | Thickness of | | |
| | Non-Metal Phase in Composite Material | | | | Metal Foil | | Brazing | | |
| Sample No | Average Grain Size [μm] | Average Grain Size [μm] | Mixing Ratio in Volume Ratio | Content [Volume %] | Composition | Thickness [μm] | Material [μm] | Joining Condition |
|---|---|---|---|---|---|---|---|---|
| 1 | 90 | — | — | 60 | Ag | 100 | 50 | 870° C. × 5 min |
| 2 | 45 | 5 | 7:3 | 70 | Ag | 100 | 50 | 870° C. × 5 min |
| 3 | 20 | — | — | 60 | Ag | 50 | 50 | 870° C. × 5 min |
| 4 | 20 | — | — | 60 | Ag | 20 | 50 | 870° C. × 5 min |
| 5 | 20 | — | — | 60 | Ag | 100 | 50 | 870° C. × 5 min |
| 100 | 20 | — | — | 60 | Ag | 100 | 50 | 800° C. × 5 min |
| 101 | 20 | — | — | 60 | Cu | 200 | 25 | 870° C. × 5 min |

(Metal Layer)

In each of samples No. 1 to No. 5 and No. 100, a silver foil (Ag in Table 1) was used as the metal foil in the production of the metal layer. The thickness of the silver foil is selected from a range of 20 μm to 100 μm. The thickness (μm) of the silver foil of each of the samples is shown in Table 1. The content of Ag in the silver foil is more than or equal to 99.9 atomic %. The silver foil has a surface roughness Ra of less than or equal to 2.0 μm.

In sample No. 101, a copper foil (Cu in Table 1) was used as the metal foil in the production of the metal layer. The thickness of the copper foil is 200 μm. The copper foil has a surface roughness Ra of less than or equal to 2.0 μm.

Figure 3:
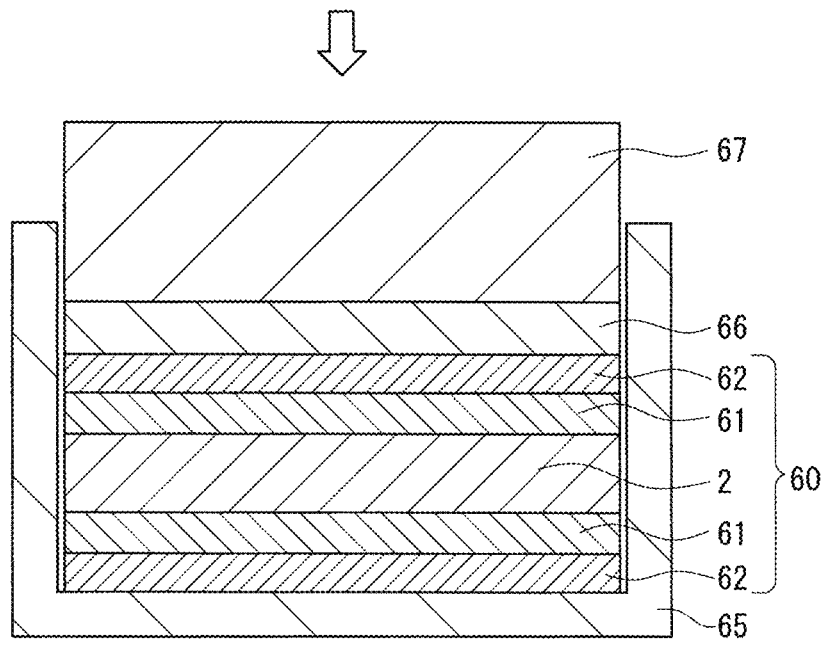
FIG. 3 is an explanatory diagram illustrating a method of producing a sample in a test example 1.

After the substrate composed of the composite material is removed from the mold, the metal layer is formed on the unpolished substrate. Here, as shown in FIG. 3, brazing materials 61 are provided on the front and rear surfaces of substrate 2. Metal foils 62 are provided to sandwich the intermediate multilayer product, i.e., brazing material 61, substrate 2, and brazing material 61. A multilayer product 60, in which metal foil 62, brazing material 61, substrate 2, brazing material 61, and metal foil 62 are layered in this order, is stored in a mold 65 composed of carbon. Mold 65 has a cylindrical shape with a bottom. Multilayer product 60 is stored in mold 65 such that the depth direction of mold 65 is parallel to the layering direction of multilayer product 60. In this stored state, one of metal foils 62 (lower metal foil 62 in FIG. 3) is in contact with the inner surface of mold 65. A protection plate 66 composed of carbon is placed on the other metal foil 62 (upper metal foil 62 in FIG. 3). A weight 67 is placed on protection plate 66. It should be noted that in FIG. 3, for ease of understanding, each of the component members of multilayer product 60 are shown to be thick.

Under application of pressure by weight 67, substrate 2 and each metal foil 62 are joined by corresponding brazing material 61 under the following joining condition. The joining condition (the heating temperature (° C.) and the holding time (minute)) for each of the samples is shown in Table 1.

(Joining Condition)

Heating temperature: 870° C. or 800° C.
Holding time: 5 minutes
Atmosphere: vacuum atmosphere or argon atmosphere
Applied pressure (load of weight 67): selected from a range of more than or equal to 10 kPa and less than or equal to 100 kPa The load on the sample in which the thickness of metal foil 62 was more than or equal to 100 μm was set to be larger In each of the composite members of samples No. 1 to No. 5, No. 100, and No. 101, the composition of the boundary region of the metal layer with the substrate was analyzed. Results thereof are shown in Table 2.

Here, assuming that the boundary region was 100 atomic %, the content of Ag (atomic %), the content of Cu (atomic %), the content of Ti (atomic %), and the content of Sn (atomic %) were examined. Also, a ratio of the content of Cu to the total content of Ag and Cu (Cu/(Ag+Cu); atomic %) was examined.

The composition of the boundary region was analyzed by setting a measurement region from the boundary region as described below and performing analysis on the measurement region (see FIG. 2).

The composite member of each sample is cut along a plane along the thickness direction of the substrate to obtain a cross section. The cross section is observed by an SEM. In an SEM image of the cross section, a position (reference point 50) of non-metal phase 20 (here, coated grains 21) closest to surface 3*f* of metal layer 3 in composite material 10 of substrate 2 is determined. Next, a horizontal line 51 extending through reference point 50 is drawn. A straight line (upper straight line 52) extending through a position above reference point 50 by 15 μm and parallel to horizontal line 51 is drawn along the thickness direction of substrate 2. Further, a straight line (lower straight line 53) extending through a position below reference point 50 by 15 μm and parallel to horizontal line 51 is drawn.

A region having a width of 30 μm between upper straight line 52 and lower straight line 53 is defined as boundary region 30. In boundary region 30, non-metal phase 20 is permitted to be contained as shown in FIG. 2. In boundary region 30, a rectangular region having a length of 300 μm is defined as measurement region 5.

In the above-described measurement region, the composition in the measurement region is analyzed by energy dispersive X-ray spectroscopy (EDX). Here, an EDX device attached to the SEM was used. For example, a known silicon drift detector (SDD) can be used as the EDX device.

Here, ten different measurement regions are defined in each of the samples, and the content of Ag, the content of Cu, the content of Ti, the content of Sn, and the ratio of the content of Cu (Cu/(Ag+Cu)) are determined in each of the measurement regions. The average values thereof in the ten different regions are shown in Table 2.

Further, the following matters were examined in each of the composite members of samples No. 1 to No. 5, No. 100, and No. 101:

(1) the content (atomic %) of Cu in the surface of the metal layer;

(2) surface roughness Ra (m) of the metal layer;

(3) heat conductivity (W/(m·K)); and (4) the thickness (m) of the metal layer.

(1) Surface analysis of the metal layer was performed by the EDX. As a result, in each of samples No. 1 to No. 5 and No. 100, when the composition of the surface of the metal layer is assumed to be 100 atomic %, the content of Cu in the surface of the metal layer is less than or equal to 1.0 atomic %, particularly, less than or equal to 0.1 atomic %. That is, in each of samples No. 1 to No. 5 and No. 100, it can be said that the surface of the metal layer includes substantially no Cu. Further, substantially no Cu is precipitated in the surface of the metal layer.

In sample No. 101, the content of Ag in the surface of the metal layer was measured in the same manner. As a result, when the composition of the surface of the metal layer is assumed to be 100 atomic %, the content of Ag is less than or equal to 1.0 atomic %. Hence, it can be said that the metal layer is substantially a copper layer.

(2) Surface roughness Ra (μm) of the metal layer was measured using a commercially available surface roughness measurement device (here, a surface roughness/contour shape measurement machine SURFCOM 130A manufactured by Tokyo Seimitsu). A measurement condition is as follows: an evaluation length is 4 mm; a measurement speed is 0.3 mm/s; and a cut-off value is 0.8 mm. Results thereof are shown in Table 2. It should be noted that when surface roughness Ra of the substrate before forming the metal layer was measured in the same manner, surface roughness Ra was 1.80 μm.

(3) The heat conductivity (W/m·K) was measured in accordance with a flash method using a commercially available measurement device (here, NETZSCH LFA447). A measurement condition is a condition in accordance with ASTM E1461-13 "Standard Test Method for Thermal Diffusivity by the Flash Method".

cially available tensile tester (here, AUTOGRAPH AG-5000D manufactured by Shimadzu Corporation) with the substrate being fixed. A pulling speed is 20 mm/min. A strength when the metal layer is raptured by pulling the rod is evaluated as the joining force. As a result, the joining force of each of the composite members of samples No. 1 to No. 5 is more than or equal to 35 MPa.

In each of the composite members of samples No. 1 to No. 5, the surface of the metal layer is smooth as shown in Table 2. Specifically, surface roughness Ra of the metal layer is less than or equal to 2.0 μm. One reason why surface roughness Ra of the metal layer is small to be less than or equal to 2.0 μm is that the brazing material is used for the formation of the metal layer. It is considered that since the brazing material is provided to fill the recesses in the surface of the substrate as described above, surface roughness Ra of the silver foil was likely to be maintained even in the case where the thickness of the silver foil is comparatively small to be 20 μm (here, in the case of sample No. 4).

As shown in Table 2, in each of the composite members of samples No. 1 to No. 5, the ratio of the content of Cu (Cu/(Ag+Cu)) in the boundary region of the metal layer with the substrate is less than or equal to 20 atomic %. That is, in each of the composite members of samples No. 1 to No. 5, the ratio of the content of Cu to the total content of Ag and Cu in the boundary region is sufficiently reduced. It can be said that such a boundary region includes substantially no eutectic alloy of Ag and Cu or no alloy that is based on the eutectic alloy.

Each of the composite members of samples No. 1 to No. 5 was subjected to heat treatment of 830° C. for 20 minutes so as to evaluate the heat resistance thereof. The condition of this heat treatment is a condition similar to a condition under which a package member (for example, an insulating substrate) is joined to the surface of the composite member (here, the surface of the metal layer). As a result, in each of the composite members of samples No. 1 to No. 5, a phenomenon such as blistering, separation, or disappearance

TABLE 2

| | Metal Layer | | | | | | |
| | Boundary Region | | | | | | |
| Sample No. | Content of Ag [atomic %] | Content of Cu [atomic %] | Ratio of Content of Cu Cu/(Ag + Cu) [atomic %] | Content of Ti [atomic %] | Content of Sn [atomic %] | Surface Roughness Ra [μm] | Composite Member Heat Conductivity [W/(m · K)] |
|---|---|---|---|---|---|---|---|
| 1 | 58.60 | 11.10 | 15.93 | 0.88 | 1.25 | 0.52 | 685 |
| 2 | 51.91 | 7.53 | 12.67 | 1.15 | 1.13 | 0.35 | 623 |
| 3 | 55.31 | 7.55 | 12.01 | 0.92 | 1.02 | 0.54 | 561 |
| 4 | 61.87 | 5.37 | 7.99 | 0.99 | 1.10 | 1.64 | 618 |
| 5 | 59.88 | 8.19 | 12.03 | 0.85 | 1.17 | 0.40 | 543 |
| 100 | 58.97 | 8.19 | 27.15 | 0.85 | 1.05 | 0.45 | 521 |
| 101 | 59.80 | 29.80 | 33.26 | 0.44 | 0.58 | 0.64 | 503 |

In each of the composite members of samples No. 1 to No. 5, the substrate composed of the composite material and the metal member serving as the source material of the metal layer are joined by using the brazing material as described above. Therefore, even when the surface of the substrate is uneven, the brazing material is provided to fill recesses. As a result, the substrate and the metal layer are strongly joined and has a high joining force as described below. The joining force between the substrate and the metal layer was examined as follows. The surface of the metal layer and a rod composed of copper are soldered using a Pb (lead)-free solder. The rod composed of copper is pulled by a commerof the metal layer was not substantially caused, and the metal layer was maintained appropriately. It can be said that the heat-resistant temperature of each of the composite members of samples No. 1 to No. 5 is a temperature of more than the melting temperature (for example, 780° C.) of the eutectic alloy or the like, and is 830° C. herein.

On the other hand, in the composite members of samples No. 100 and No. 101, the ratios of the contents of Cu (Cu/(Ag+Cu)) in the boundary regions of the metal layers with the substrates are respectively about 27 atomic % and about 33 atomic % and are therefore more than 20 atomic %. Since diffusion of Cu is insufficient in each of the boundary regions and the ratio of the content of Cu in the boundary region is high, it can be said that the above-described eutectic alloy or the like is included therein. Each of the composite members of samples No. 100 and No. 101 was subjected to the heat treatment of 830° C. for 20 minutes so as to evaluate the heat resistance thereof. As a result, blistering of the metal layer was caused in the composite member of sample No. 100 and disappearance of the metal layer was caused in the composite member of sample No. 101.

The following describes one of conceivable reasons why different results were obtained between samples No. 1 to No. 5 and samples No. 100 and No. 101 even though the brazing materials of the same composition were used.

In the production process of each of samples No. 1 to No. 5, Ag is the main component of each of the metal phase in the composite material of the substrate and the metal member serving as the source material of the metal layer. Therefore, even though the eutectic alloy-based brazing material of Ag and Cu is used, Ag in the metal phase having a very small content of Cu and Ag in the metal member can be present adjacent to the brazing material. Moreover, here, the joining condition is set to a condition with a comparatively high temperature to facilitate diffusion of Cu. Therefore, it is considered that Cu in the brazing material was diffused into Ag of the adjacent metal phase and Ag of the adjacent metal member after the brazing material was melted to contribute to the joining of the substrate and the metal member. As a result, it is considered that the ratio of the content of Cu in the boundary region is greatly decreased to be small, thus making it difficult to form an eutectic alloy of Ag and Cu in the boundary region.

On the other hand, in the production process of sample No. 100, Ag in the metal phase having a very small content of Cu and Ag in the metal member are present adjacent to the eutectic alloy-based brazing material as in samples No. 1 to No. 5. However, since the heating temperature during the joining is low to be 800° C., it is considered that Cu in the brazing material is not sufficiently diffused into the adjacent metal phase and the adjacent metal member and the ratio of the content of Cu in the boundary region is not greatly decreased, thus facilitating formation of the eutectic alloy of Ag and Cu. On the other hand, in the production process of sample No. 101, even though the main component of the metal phase in the substrate is Ag, the main component of the metal member is Cu. Therefore, Cu in the eutectic alloy-based brazing material is diffused into Ag in the metal phase having a very small content of Cu. However, Cu in the metal member having a very large content of Cu is diffused into the brazing material. Particularly, in this test, since the joining is performed under such a condition that Cu is facilitated to be diffused, Cu in the metal member is facilitated to be diffused into the brazing material. As a result, it is considered that the ratio of the content of Cu in the boundary region is not greatly decreased, thereby facilitating the formation of the eutectic alloy of Ag and Cu.

In view of the above, it has been indicated that even when exposed to a high temperature such as 800° C. or 830° C., a phenomenon such as blistering, separation, or disappearance of the metal layer is unlikely to occur in the composite member satisfying the following (Requirement) and the composite member has an excellent heat resistance.

(Requirement) Each of the metal phase in the substrate and the metal layer is mainly composed of Ag. Moreover, the ratio of the content of Cu (Cu/(Ag+Cu)) in the boundary region of the metal layer with the substrate is less than or equal to 20 atomic %.

In addition, from this test, the following matters are understood with regard to each of the composite members of samples No. 1 to No. 5.

(a) The heat conductivity is high to be more than or equal to 500 W/m·K, particularly, more than or equal to 530 W/m·K. Since such a composite member has an excellent heat conductivity, the composite member can be suitably used for a heat radiation member of a semiconductor element or the like.

(b) One reason for the excellent heat conductivity is that the non-metal phase in the composite material includes diamond. As the average grain size of the diamond grains is larger, the heat conductivity tends to be more excellent (see, for example, a comparison between samples No. 1 and No. 5). Further, when large grains are included and the content of the diamond grains is large, the heat conductivity tends to be more excellent (see, for example, a comparison between samples No. 2 and No. 5). Another reason therefor is that each of the metal phase in the composite material and the metal layer is a metal mainly composed of Ag.

(c) Still another reason for the excellent heat conductivity is that the content of Ti in the boundary region of the metal layer with the substrate is more than or equal to 0.1 atomic % and less than or equal to 2.0 atomic %. It is considered that Ti included in the boundary region contributes to improvement of the wettability of the non-metal phase in the composite material with respect to the brazing material in the molten state. Also in this respect, the substrate and the metal layer are adhered to each other, with the result that the heat conductivity is facilitated to be improved. Further, since an excess of Ti is not included in the boundary region, a decrease in heat conductivity due to an excess of Ti being contained can be prevented. It should be noted that since the substrate and the metal layer are adhered to each other, it is considered that the above-described high joining force is attained.

(d) As described above, surface roughness Ra of the metal layer is small and the surface of the metal layer is smooth. Therefore, when a package member or the like is joined to the surface of the metal layer of the composite member, voids are unlikely to be present between the metal layer and the package member or the like. Therefore, a decrease in heat conductivity due to the presence of voids can be prevented.

(e) The thickness of each of the metal layers of the composite members of samples No. 1 to No. 5 was measured. Here, the thickness of the metal layer was measured by using the SEM image of the cross section of the composite member of each of the above-described samples. The boundary between the substrate and the metal layer is represented by the lower straight line described with regard to the extraction of the boundary region of the metal layer. The thickness of the metal layer is represented by a length along the thickness direction of the substrate from the boundary between the substrate and the metal layer to the surface of the metal layer. The thickness of the metal layer of each of samples No. 1 to No. 5 is more than or equal to 20 μm and less than or equal to 200 μm. The thickness of each of the metal layers of samples No. 1 to No. 5 is substantially the same as the thickness of the silver foil. Also in view of such a fact that the thickness of the metal layer is less than or equal to 200 μm, it is considered that the heat conductivity is excellent. For example, in comparison between sample No. 3 and sample No. 4, the heat conductivity of sample No. 4 having a thin metal layer is higher than the heat conductivity of sample No. 3. Further, also in view of such a fact that the thickness of the metal layer is more than or equal to 20 μm in each of samples No. 1 to No. 5, it is considered that the surface of the metal layer is likely to be smooth. In view of sample No. 1, even when comparatively large grains in the non-metal phase are included, the surface of the metal layer is smooth because the metal layer is thick to some extent. In comparison between samples No. 3 and No. 5, sample No. 5 having a thick metal layer has a more smooth surface. Hence, when the metal layer is thick, the smoothness tends to be excellent.

(f) In each of the composite members of samples No. 1 to No. 5, a change in heat conductivity before and after heat treatment was examined. Here, the heat conductivity was measured in such a manner that the composite member was held at 830° C. for 20 minutes and then was cooled to a room temperature (here, about 20° C.). Then, a ratio of change={ (the heat conductivity before the heating–the heat conductivity after the heating)/the heat conductivity before the heating}×100 was determined. As a result, in each of the composite members of samples No. 1 to No. 5, the ratio of change in heat conductivity before and after the heat treatment was less than or equal to 5%. In view of this, it is understood that each of these composite members can maintain the high heat conductivity even when exposed to about 830° C.

Further, in each of the composite members of samples No. 1 to No. 5, a change in heat conductivity due to a cooling/heating cycle was examined. One cycle corresponds to an operation in which the composite member of each of the samples is immersed for 10 minutes in a test liquid held at −60° C. and is then immersed for 10 minutes in a test liquid held at 150° C. The heat conductivity is measured after performing 100 cycles of the cooling/heating cycle. Then, a ratio of change={(the heat conductivity before the cooling/heating cycle—the heat conductivity after the cooling/heating cycle)/the heat conductivity before the cooling/heating cycle}×100 was determined. As a result, in each of the composite members of samples No. 1 to No. 5, the ratio of change in heat conductivity due to the cooling/heating cycle was less than or equal to 5%. In view of this, it is understood that each of these composite members can maintain the high heat conductivity even when subjected to the cooling/heating cycle. It should be noted that for each of the test liquids, a fluorine-based inactive liquid ("Galden (registered trademark)", "Fluorinert (trade name)", or the like can be used.

The present invention is defined by the terms of the claims, rather than these examples, and is intended to include any modifications within the scope and meaning equivalent to the terms of the claims.

For example, in test example 1, it is possible to appropriately change the composition of the metal phase in the composite material, the composition, grain size, and content of the non-metal phase, the thickness of the substrate, the composition and thickness of the brazing material, the composition and thickness of the metal member, the joining condition, and the like.

REFERENCE SIGNS LIST

1: composite member; 2: substrate; 10: composite material; 20: non-metal phase; 25: metal phase; 21: coated grain; 22: core grain; 23: coating layer; 3: metal layer; 3f: surface; 3b: boundary; 30: boundary region; 35: precipitate; 5: measurement region; 50: reference point; 51: horizontal line; 52, 53: straight line; 60: multilayer product; 61: brazing material; 62: metal foil; 65: mold; 66: protection plate; 67: weight.

The invention claimed is:

1. A composite member comprising:
   a substrate composed of a composite material including a non-metal phase and a metal phase; and
   a metal layer that covers at least a portion of a surface of the substrate, wherein
   a metal included in each of the metal phase and the metal layer is mainly composed of Ag,
   a boundary region of the metal layer with the substrate includes Cu,
   a ratio of a content of Cu to a total content of Ag and Cu in the boundary region of the metal layer with the substrate is more than or equal to 7.99 atomic % and less than or equal to 15.93 atomic %,
   the boundary region includes Ti and Sn,
   a content of Ti in the boundary region is more than or equal to 0.1 atomic % and less than or equal to 2.0 atomic % when a composition of the boundary region is assumed to be 100 atomic %,
   a content of Sn in the boundary region is more than 0 atomic % and less than or equal to 3.0 atomic % when the composition of the boundary region is assumed to be 100 atomic %,
   the composite member is a heat radiation member,
   the non-metal phase includes a plurality of coated grains that include diamond grains and carbide layers coating and provided on each of the diamond grains, the carbide layers consist of at least one selected from the group consisting of SiC, TiC, ZrC, HfC, TaC, and $Cr_3C_2$,
   the content of non-metal phase to the composite material is more than or equal to 40 vol % and less than or equal to 90 vol %, and
   the metal layer includes a precipitate composed of Cu and is in contact with non-metal phase.

2. The composite member according to claim 1, wherein a thickness of the metal layer is more than or equal to 20 μm and less than or equal to 200 μm.

3. The composite member according to claim 1, wherein a surface roughness Ra of the metal layer is less than or equal to 2.0 μm.

4. The composite member according to claim 1, wherein a content of Cu in a surface of the metal layer is less than or equal to 1.0 atomic % when a composition of the surface is assumed to be 100 atomic %.

5. The composite member according to claim 1, wherein the boundary region further includes one or more elements selected from Zn and In.

6. The composite member according to claim 5, wherein, a content of the one or more elements is less than or equal to 3.0 atomic %.

7. The composite member according to claim 1, wherein the content of Sn is more than or equal to 1.02 atomic % and less than or equal to 1.25 atomic %.

8. The composite member according to claim 1, wherein the content of Ti is more than or equal to 0.85 atomic % and less than or equal to 1.15 atomic %.

9. The composite member according to claim 1, wherein the content of non-metal phase to the composite material is more than or equal to 60 vol % and less than or equal to 90 vol %.

10. A manufacturing method of the composite member according to claim 1, comprising:
    preparing the substrate composed of the composite material including the non-metal phase and the metal phase mainly composed of Ag, and a metal member mainly composed of Ag;

joining the substrate and the metal member by a brazing material including Ag and Cu; and performing heat treatment after joining the substrate and the metal member, wherein, the heat treatment is performed at a temperature of less than the melting point of the eutectic alloy of Ag and Cu.

\* \* \* \* \*